United States Patent [19]
Lai et al.

[11] Patent Number: 6,119,294
[45] Date of Patent: Sep. 19, 2000

[54] CLEANING SYSTEM WITH AUTOMATICALLY CONTROLLED BRUSH PRESSURE

[75] Inventors: Chien-Hsin Lai, Kaohsiung Hsien; Juen-Kuen Lin, Kaohsiung; Kun-Lin Wu, Taichung; Peng-Yih Peng, Hsinchu Hsien, all of Taiwan

[73] Assignee: United Microelectronics Corp., Hsinchu, Taiwan

[21] Appl. No.: 09/232,203

[22] Filed: Jan. 14, 1999

[51] Int. Cl.$^7$ .................................................. A46B 13/02
[52] U.S. Cl. .................................. 15/77; 15/88.2; 15/88.3
[58] Field of Search ............................. 15/77, 88.2, 88.3, 15/97.1, 21.1, 102

[56] References Cited

U.S. PATENT DOCUMENTS

| | | | |
|---|---|---|---|
| 4,993,097 | 2/1991 | D'Amato | 15/77 |
| 5,475,889 | 12/1995 | Thrasher et al. | 15/77 |
| 5,636,401 | 6/1997 | Yonemizu et al. | 15/77 |
| 5,860,178 | 1/1999 | Nishimura et al. | 15/77 |
| 5,943,726 | 8/1999 | Eitoku et al. | 15/77 |

*Primary Examiner*—Robert J. Warden, Sr.
*Assistant Examiner*—Theresa T. Snider
*Attorney, Agent, or Firm*—Thomas, Kayden, Horstemeyer & Risley

[57] ABSTRACT

An auto brush pressure cleaning system is described. The system includes a first pneumatic brush, a second pneumatic brush disposed to align with the first pneumatic brush adjacent and parallel to the first pneumatic brush, and a computer. The system also includes a first brush pressure regulator electrically coupled to the computer and transmitting a first and a second signal to the computer and a second brush pressure regulator coupled to the second pneumatic brush and the first brush pressure regulator through a first three-way valve and electrically coupled to the computer, wherein the second pneumatic brush transmits a third signal to the second brush pressure regulator and to the first brush pressure regulator and the second brush pressure regulator transmits a fourth signal to the computer. The system further includes a first electro-pressure regulator coupled to the first brush pressure regulator and the first pneumatic brush through a second three-way valve, wherein the first brush pressure regulator receives a fifth signal from the first pneumatic brush and a second electro-pressure regulator coupled to the second pneumatic brush and electrically coupled to the first electro-pressure regulator and the computer, wherein the computer transmits a sixth signal to the second and the first electro-pressure regulators.

24 Claims, 1 Drawing Sheet

CLEANING SYSTEM WITH AUTOMATICALLY CONTROLLED BRUSH PRESSURE

BACKGROUND OF THE INVENTION

1. Field of the Invention

The present invention relates to a chemical-mechanical polishing machine. More particularly, the present invention relates to cleaning system with automatically controlled brush pressure.

2. Description of the Related Art

In the semiconductor process, planarization is an important technique for the treatment of high-density photolithography. A planar surface without irregularities can prevent exposure light from being scattered, so that a fine pattern can be precisely transferred to a wafer. Typically, planarization techniques include spin-on glass (SOG) and chemical-mechanical polishing (CMP). However. SOG cannot supply a sufficient degree of planarity as the wire width approaches to the sub-half-micron level. Therefore, CMP is the only technique that currently can provide global planarization in very large scale integration (VLSI) and ultra large scale integration (ULSI).

CMP is a planarization process that planarizes an uneven surface by applying mechanical polishing and adding a suitable slurry. Generally, slurry is formed by a composition of abrasive particles such as colloidal silica or dispersed alumina and an alkaloid solution such as potassium hydroxide solution or ammonium. The size of these high hardness particles dispersed in the slurry is about 0.1–2.0 $\mu$m. Usually before the slurry is driven to the polishing pad of the CMP machine to perform a CMP process, the slurry is filtered through a filter to protect the wafer from being scratched by impurities in the slurry. After the CMP process is performed, the residual slurry is removed completely from the wafer by scouring, spray-cleaning, ultrasonic cleaning, etc.

Conventionally, in the scouring method, the proximity of the brush heads can be adjusted statically to match the surface of the wafer in order to scour both sides of the wafer. However, during scouring, the proximity of the brush heads to the wafer cannot be changed, so there is no dynamic response to a wafer-cleaning process once the process begins. This inability to adjust the brushes gives rise to the formation of microscratches on the water.

SUMMARY OF THE INVENTION

The invention provides a cleaning system with automatically controlled brushes pressure. The cleaning system with automatically controlled brushes pressure according to invention can easily control the dynamic response of the scouring by closed-loop feedback signal of changing the proximity of the brush heads to the wafer.

To achieve these and other advantages and in accordance with the purpose of the invention, as embodied and broadly described herein, the invention provides an auto brush pressure cleaning system. The system includes a first pneumatic brush, a second pneumatic brush disposed to align with the first pneumatic brush adjacent and parallel to the first pneumatic brush and a computer. The system also includes a first brush pressure regulator electrically coupled to the computer and transmitting a first and a second signal to the computer and a second brush pressure regulator coupled to the second pneumatic brush and the first brush pressure regulator through a first triple valve and electrically coupled to the computer. The second pneumatic brush transmits a third signal to the second brush pressure regulator and to the first brush pressure regulator and the second brush pressure regulator transmits a fourth signal to the computer. The system further includes a first electro-pressure regulator coupled to the first brush pressure regulator and the first pneumatic brush through a second triple valve, wherein the first brush pressure regulator receives a fifth signal from the first pneumatic brush and a second electro-pressure regulator coupled to the second pneumatic brush and electrically coupled to the first electro-pressure regulator and the computer, wherein the computer transmits a sixth signal to the second and the first electro-pressure regulators. The pressures of the gas flowing into the first and the second pneumatic brushes are adjusted by the sixth signal based on the first, the second and the fourth signals. Hence, by monitoring the variation of the inner pressures of the first and the second pneumatic brushes while the scouring process is performed to clean a wafer, the dynamic response of the scouring can be easily controlled by changing the proximity of the brush heads to the wafer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
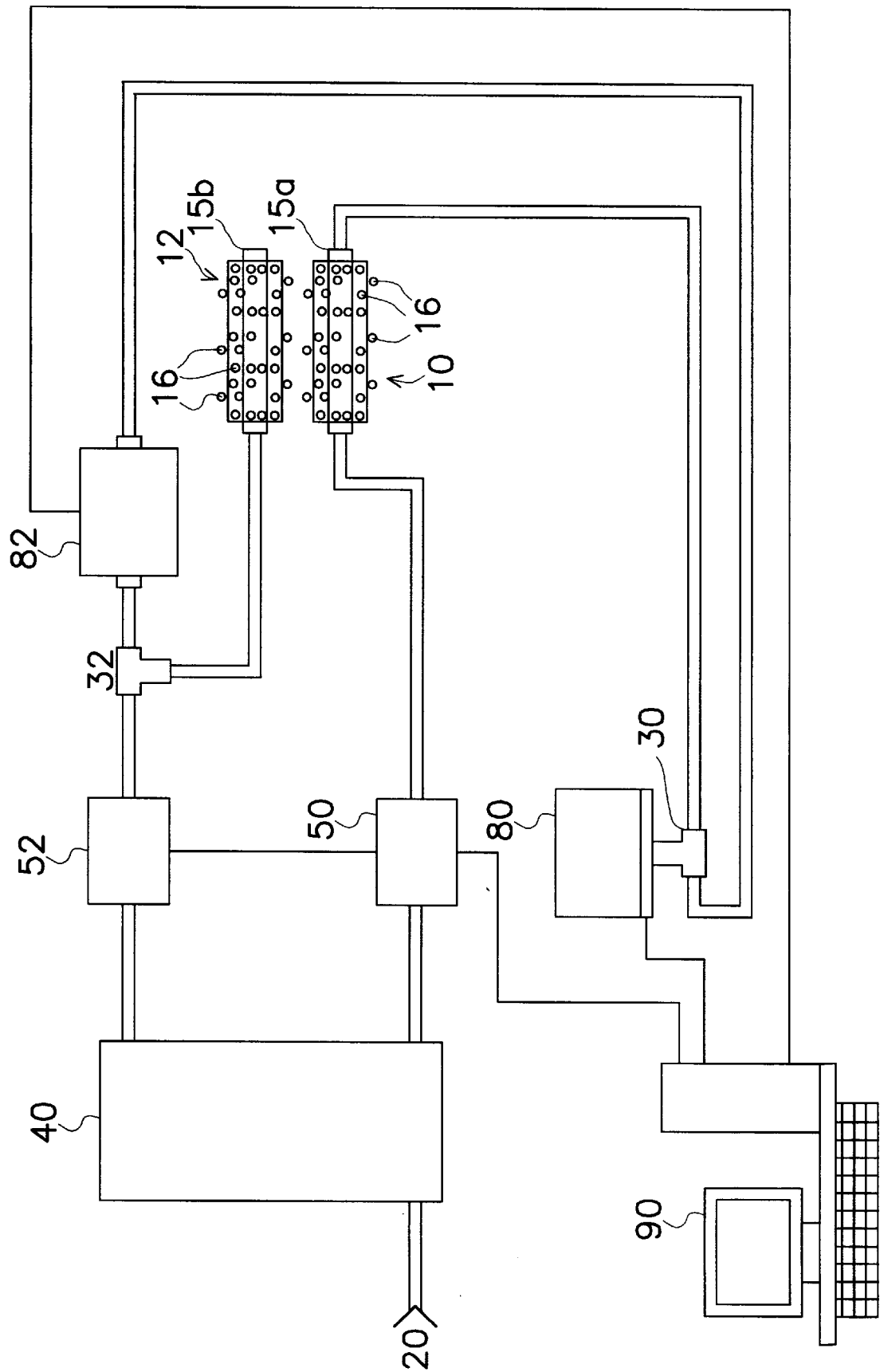
FIG. 1 is a schematic drawing of an auto brush pressure cleaning system in a preferred embodiment according to the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic drawing of an auto brush pressure cleaning system in a preferred embodiment according to the invention.

As shown in FIG. 1, the auto brush pressure cleaning system includes two pneumatic brushes 10 and 12 and two brush pressure transducers 80 and 82. The pneumatic brush 10 is disposed to align with the pneumatic brush 12 adjacent to and parallel to the pneumatic brush 10, so the two pneumatic brushes 10 and 12 can simultaneously scour both surfaces of a wafer which has been planarized by CMP. Each of the pneumatic brush 10 and 12 comprises brush coils 15a and 15b, respectively, and several brush hairs 16 on each of the brush coils 15a and 15b. The brush pressure transducer 80 is coupled to the pneumatic brush 10 and the brush pressure transducer 82 through a three-way valve 30. The system also includes two electro-pressure (E/P) regulators 50 and 52, which are electrically coupled to each other. The E/P regulator 50 is coupled to the pneumatic brush 10. The E/P regulator 52, the brush pressure transducer 82 and the pneumatic brush 12 are coupled through a three-way valve 32. The system further includes a pressure regulator system 40, respectively coupled to both E/P regulators 50 and 52, a clean-dry-air (CDA) entrance 20 coupled to the pressure regulator system 40 and a computer 90, respectively electrically coupled to the E/P regulator 50 and both brush pressure transducers 80 and 82.

The brush coils 15a and 15b can be pneumatically pressurized to increase the size of the pneumatic brushes 10 and 12, so the brush hair 16 on the brush coils 15a and 15b can approach a wafer (not shown) to match with both surfaces of the wafer. The CDA flows into the brush coils 15a and 15b, and the motions of the brush coils 15a and 15b are varied with the pressure of the CDA flowing into the brush coils 15a and 15b. The brush pressure transducers 80 and 82 can receive the pressure values and transform the pressure values into digital signals, The E/P regulator 50 and 52 can receive the digital signals and convert the digital signals into the pressure values, and then the E/P regulator 50 and 52 can adjust the pressure of the CDA flowing to the brush coils 15a and 15b by the pressure values.

While the scouring process is performed after CMP, CDA flows from the entrance 20 into the auto brush cleaning system. The CDA simultaneously flows into two pathways. One pathway is through the pressure regulator 40 and the E/P regulator 50 to the brush coil 15a. Another pathway passes through the E/P regulators 52 and then to the brush pressure transducer 82 and the brush coil 15b.

The brush coil 15a of the pneumatic brush 10 responds to the pneumatic pressure while the scouring process is performed to clean the wafer (not shown). A feedback pressure denoting the inner pressure of the brush coil 15a is transmitted from the brush coil 15a to the brush pressure transducer 80 and to the brush pressure transducer 82 through the three-way valve 30 while the scouring process is performed to clean the wafer shown). The feedback pressure is transformed into a feedback digital signal I by the brush pressure transducer 80. The feedback digital signal I is transmitted to the computer 90.

Simultaneously, since the CDA is separated into the brush pressure transducer 82 and the pneumatic brush 12 a feedback pressure denoting the inner pressure of the brush coil 15b can be implied by the pressure of the CDA received by the brush pressure transducer 82. The brush pressure transducer 82 receives a feedback pressure of the brush coil 15b and the feedback pressure denoting the inner pressure of the brush coil 15a while the Scouring process is performed to clean the wafer (not shown). The brush pressure transducer 82 integrates and transforms the feedback pressure representing the inner pressure of the brush coil 15b and the feedback pressure representing the inner pressure of the brush coil 15a into two digital signals II and III. The digital signal II denotes the feedback pressure representing the inner pressure of the brush coil 15b. The digital signal III denotes the difference between the feedback pressure denoting the inner pressure of the brush coil 15b and the feedback pressure denoting the inner pressure of the brush coil 15a. The digital signals II and III are transmitted to the computer 90.

By comparing three digital signals I, II and III while the scouring process is performed to clean the wafer (not shown), a digital signal IV used to control the pressures of the CDA flowing into the brush coils 15a and 15b is outputted to the E/P regulator 50 and to the E/P regulator 52 through the E/P regulator 50. The digital signal IV is transformed into a serial pressure value by the E/P regulators 50 and 52. The pressures of the CDA flowing into the brush coils 15a and 15b are adjusted by the digital signal VI based on the digital signals I, II and III. Since the motions of the brush coils 15a and 15b are varied with the pressure of the CDA flowing into the brush coils 15a and 15b, the scouring motions of the brush coils 15a and 15b can be well controlled by the computer through the digital signal IV.

Accordingly, by monitoring the variation of the inner pressures of the brush coils 15a and 15b while the scouring process is performed to clean the wafer, the dynamic response of the scouring can be easily controlled by changing the dovetailing level between the brush heads and the wafer. Moreover the pneumatic brushes 10 and 12 can be easily controlled by the computer, automatically. Therefore, the conventional problem of microscratches caused by scouring the wafer can be solved.

The preferred embodiment according to the invention is denoted by a system having two pneumatic brushes, two brush pressure transducers, two E/P regulators and one pressure regulator. In the application of the auto brush cleaning system to the industry, the system according to the invention may include more than two pneumatic brushes, two brush pressure transducers, two E/P regulators and one pressure regulator. Additionally, between the pneumatic brush 10 and the E/P regulator 50, the system may further comprise a check valve and a buffer. The check valve is used to prevent the system from the reflux of the CDA from the pneumatic brush 10 to the E/P regulator 50. The buffer is used to stabilize the pressure of the CDA and protect the CDA from sharpness due to the CDA pressure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A cleaning system with automatically controlled brushes used to clean a wafer after a chemical-mechanical polishing procedure, the system comprising:

a first pneumatic brush;

a second pneumatic brush aligned with the first pneumatic brush, wherein the second pneumatic brush is adjacent and parallel to the first pneumatic brush;

a computer;

a first brush pressure transducer electrically coupled to the computer, wherein the first brush pressure transducer transmits a first and a second signal to the computer;

a second brush pressure transducer coupled to the second pneumatic brush and the first brush pressure transducer through a first three-way valve and electrically coupled to the computer, wherein the second pneumatic brush transmits a third signal to the second brush pressure transducer and to the first brush pressure regulator and the second brush pressure transducer transmits a fourth signal to the computer;

a first electro-pressure regulator coupled to the first brush pressure transducer and the first pneumatic brush through a second three-way valve, wherein the first brush pressure transducer receives a fifth signal from the first pneumatic brush; and a second electro-pressure regulator coupled to the second pneumatic brush and electrically coupled to the first electro-pressure regulator and the computer, wherein the computer transmits a sixth signal to the second and the first electro-pressure regulators, wherein the signals are processed by the computers to allow for a change in proximity of the brushes to the wafer being cleaned.

2. The auto brush cleaning system of claim 1, wherein the first, the second, the fourth and the sixth signals are all digital signals.

3. The auto brush cleaning system of claim 2, wherein the first signal denotes a difference between a feedback pressure of the first pneumatic brush and a feedback pressure of the second pneumatic brush.

4. The auto brush cleaning system of claim 2, wherein the second signal denotes the feedback pressure of the second pneumatic brush.

5. The auto brush cleaning system of claim 2, wherein the fourth signal denotes the feedback pressure of the first pneumatic brush.

6. The auto brush cleaning, system of claim 2, wherein the sixth signal is an instruction to the computer for controlling the first and the second electro-pressure regulators.

7. The auto brush cleaning system of claim 1, wherein both the third and the fifth signals are pressure values.

8. The auto brush cleaning system of claim 7, wherein the third signal denotes the feedback pressure value of the second pneumatic brush.

9. The auto brush cleaning system of claim 7, wherein the fifth signal denotes the feedback pressure value of the first pneumatic brush.

10. The auto brush cleaning system of claim 1, wherein the first pneumatic brush further comprises a brush coil and brush hair on the brush coil.

11. The auto brush cleaning system of claim 1, wherein the second pneumatic brush further comprises a brush coil and brush hair on the brush coil.

12. The auto brush cleaning system of claim 1, wherein the first and the second pneumatic brushes simultaneously scour both surfaces of a wafer.

13. The auto brush cleaning system of claim 1, wherein the system further comprises:

a pressure regulator coupled to the first and the second electro-pressure regulators; and a gas entrance coupled to the pressure regulator.

14. The auto brush cleaning system of claim 1, wherein the system further comprises a check valve and a buffer between the second pneumatic brush and the second electro-pressure regulator.

15. An auto brush cleaning system used to clean a wafer after a chemical-mechanical polishing, the system comprising:

a first plurality of pneumatic brushes;

a second plurality of pneumatic brushes disposed to align with the first pneumatic brushes, wherein the second plurality of pneumatic brushes is adjacent and parallel to the first pneumatic brushes;

a computer;

a first plurality of brush pressure transducers electrically coupled to the computer and transmitting a first and a second signals to the computer;

a second plurality of brush pressure transducers respectively coupled to the second pneumatic brushes and the first brush pressure transducers through a first plurality of three-way valves and electrically coupled to the computer, wherein the second pneumatic brushes respectively transmit a third signal to the second brush pressure transducers and to the first brush pressure transducers, and the second brush pressure transducers transmit a fourth signal to the computer;

a first plurality of electro-pressure regulators respectively coupled to the first brush pressure transducers and the first pneumatic brushes through a second plurality of three-way valves, wherein the first brush pressure transducers respectively receive a fifth signal from the first pneumatic brushes; and a second plurality of electro-pressure regulators respectively coupled to the second pneumatic brushes and electrically coupled to the first electro-pressure regulators, respectively and electrically coupled to the computer wherein the computer transmits a sixth signal to the second and the first electro-pressure regulators, wherein the signals are processed by the computer to allow for a change in proximity of the brushes to the wafer being cleaned.

16. The auto brush cleaning system of claim 15, wherein the first, the second, the fourth and the sixth signals are all digital signals.

17. The auto brush cleaning system of claim 16, wherein the first signals respectively denote differences between feedback pressures of the first pneumatic brushes and feedback pressures of the second pneumatic brushes.

18. The auto brush cleaning system of claim 16, wherein the second signals respectively denote the feedback pressures of the second pneumatic brushes.

19. The auto brush cleaning system of claim 16, wherein the fourth signals respectively denote the feedback pressures of the first pneumatic brushes.

20. The auto brush cleaning system of claim 16, wherein the sixth signals are the instructions of the computer to respectively control the first and the second electro-pressure regulators.

21. The auto brush cleaning system of claim 15, wherein both the third and the fifth signals are pressure values.

22. The auto brush cleaning system of claim 21, wherein the third signals respectively denote the feedback pressure values of the second pneumatic brushes.

23. The auto brush cleaning system of claim 21, wherein the fifth signals respectively denote the feedback pressure values of the first pneumatic brushes.

24. The auto brush cleaning system of claim 21, wherein the first and the second pneumatic brushes simultaneously scour both surfaces of a plurality of wafers.

* * * * *